United States Patent
Sanduleanu et al.

(10) Patent No.: US 9,190,953 B2
(45) Date of Patent: *Nov. 17, 2015

(54) SPEED OF LIGHT BASED OSCILLATOR FREQUENCY

(71) Applicant: International Business Machines Corporation, Armonk, NY (US)

(72) Inventors: Mihai A. Sanduleanu, Yorktown Heights, NY (US); Bodhisatwa Sadhu, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/154,247

(22) Filed: Jan. 14, 2014

(65) Prior Publication Data

US 2015/0084709 A1     Mar. 26, 2015

Related U.S. Application Data

(63) Continuation of application No. 14/036,205, filed on Sep. 25, 2013.

(51) Int. Cl.
   *H03B 5/30*     (2006.01)
   *H03B 5/18*     (2006.01)
   *H03B 1/00*     (2006.01)
   *H03L 7/24*     (2006.01)
   *H03B 5/12*     (2006.01)

(52) U.S. Cl.
   CPC .............. *H03B 5/1847* (2013.01); *H03B 1/00* (2013.01); *H03B 5/1215* (2013.01); *H03B 5/1841* (2013.01); *H03B 5/1852* (2013.01); *H03L 7/24* (2013.01)

(58) Field of Classification Search
   CPC .. H03B 5/1852; H03B 5/1841; H03B 5/1847; H03B 1/00; H03B 5/1215; H03L 7/24
   USPC ..................................... 331/96, 107 SL, 154
   See application file for complete search history.

(56) References Cited

U.S. PATENT DOCUMENTS

| | | | |
|---|---|---|---|
| 5,187,450 A | 2/1993 | Wagner et al. | |
| 6,853,260 B1 | 2/2005 | Hajimiri et al. | |
| 7,119,625 B2 | 10/2006 | Aikawa et al. | |
| 7,365,612 B2 | 4/2008 | Rohde et al. | |
| 7,852,176 B2 * | 12/2010 | Chang et al. | ........... 333/246 |
| 8,035,457 B2 | 10/2011 | Chang et al. | |

OTHER PUBLICATIONS

Andress et al., "Surpassing Tradeoffs by Separation: Examples in Frequency Generation Circuits", IEEE, 2008, pp. 130-133.
Cai et al., "80 GHz on-chip metamaterial resonator by differential transmission line loaded with split ring resonator", Electronics Letters, vol. 48, No. 18, Aug. 30, 2012, pp. 1-2.
(Continued)

*Primary Examiner* — Arnold Kinkead
(74) *Attorney, Agent, or Firm* — Cantor Colburn LLP

(57) ABSTRACT

An oscillator and a method of fabricating the oscillator are described. The oscillator includes a resonator with a plurality of transmission lines. An oscillation frequency of the oscillator is independent of at least one dimension of the plurality of transmission lines. The oscillator also includes a negative resistance circuit coupled to the resonator that cancels internal loss resistance of the resonator.

9 Claims, 16 Drawing Sheets

(56) References Cited

OTHER PUBLICATIONS

Chen et al., "Wideband Varactorless LC VCO Using a Tunable Negative-Inductance Cell", IEEE Transactions on Circuits and Systems-I:Regular Papers, vol. 57, No. 10, Oct. 2010, pp. 2609-2617.

Chiang et al., "A 3.7-mW Zero-dB Fully Integrated Active Bandpass Filter at Ka-band in 0.18-um CMOS", IEEE, 2008, pp. 1043-1045.

Decanis et al., "A mm-Wave Quadrature VCO Based on Magnetically Coupled Resonators", IEEE International Solid-State Circuits Conference, 2011, pp. 280-282.

Freundorfer et al., "Integrated on-chip Ba2Ti9O20 Dielectric Resonator Oscillator in GaAs Technology", IEEE, 2009, pp. 1105-1108.

Keller et al., "A Single-Chip Coplanar 0.8-um GaAs MESFET K/Ka-Band DRO", IEEE Microwave and Guided Wave Letters, vol. 9, No. 12, Dec. 1999, pp. 526-528.

Laskin et al., "165-GHz Transceiver in SiGe Technology", IEEE Journal of Solid-State Circuits, vol. 43, No. 5, May 2008, pp. 1087-1100.

Lin et al., "A 77-GHz CMOS On-Chip Bandpass Filter Using Slow-Wave Stepped-Impedance Resonators", Proceedings of Asia-Pacific Microwave Conference, 2010, pp. 826-828.

Liu et al., "A MM-Wave Configurable VCO Using MCPW-Based Tunable Inductor in 65-nm CMOS", IEEE Transactions on Circuits and Systems-II Express Briefs, vol. 58, No. 12, Dec. 2011, pp. 842-846.

Pokharel et al., "Design of VCO for 2.4GHz Wireless Applications Using Transmission Line Resonators", Proceedings of Asia-Pacific Microwave Conference, 2007, pp. 1-4.

Shi et al., "A Compact 5GHz Standing-Wave Resonator-based VCO in 0.13um CMOS", IEEE Radio Frequency Integrated Circuits Symposium, 2007, pp. 591-594.

Tsuchiya et al., "Measurement of On-Chip Transmission-Line with Stacked Split-Ring Resonators", IEEE, 2010, pp. 137-140.

Tsuchiya et al., "On-Chip Metamaterial Transmission-Line Based on Stacked Split-Ring Resonator for Millimeter-Wave LSIs", IEEE, 2009, pp. 1458-1461.

Yi et al., "A 100 GHz Tranformer-based Varactor-less VCO With 11.2% Tuning Range in 65nm CMOS Technology", 2012, pp. 1-4.

\* cited by examiner

SPEED OF LIGHT BASED OSCILLATOR FREQUENCY

CROSS-REFERENCE TO RELATED APPLICATION

This application is a continuation of U.S. application Ser. No. 14/036,205 filed Sep. 25, 2013, the disclosure of which is incorporated by reference herein in its entirety.

BACKGROUND

The present invention relates to a transmission line resonator, and more specifically, to a speed of light referenced frequency oscillator.

The generation of signals having frequencies with wavelengths on the order of millimeters (mm-waves) is challenged by the lack of low phase-noise oscillators that work at the carrier frequency and have a large tuning range. On-chip complementary metal-oxide-semiconductor (CMOS) variable capacitances (varactors) have low quality factors (Qs) (e.g., less than 10). As a result, a voltage-controlled oscillator (VCO) based on integrated varactors may have a high phase noise and a limited tuning range. Currently available high-Q on-chip resonators are not only bulky but also have no means to tune their frequency characteristics. Alternative devices use a phase-locked loop (PLL) working at lower frequencies and frequency multipliers (e.g., doublers, triplers) to generate a mm-wave carrier. These multiplying devices need active devices and passive devices such as inductor and capacitors. Moreover, these multipliers have poor efficiency. As a result, there is a power penalty and area penalty to generate the higher frequencies. In addition, the generated signals at mm-waves need amplifiers and buffers to drive the up/down conversion mixers.

SUMMARY

According to one embodiment of the present invention, an oscillator includes a resonator comprising a plurality of transmission lines, an oscillation frequency of the oscillator being independent of at least one dimension of the plurality of transmission lines; and a negative resistance circuit coupled to the resonator and configured to cancel internal loss resistance of the resonator.

According to another embodiment, a method of fabricating an oscillator includes arranging a plurality of transmission lines to form a resonator whose oscillation frequency is referenced to a speed of light and is independent of at least one dimension of the plurality of transmission lines; and coupling a negative resistance circuit to the resonator, the negative resistance circuit being configured to cancel internal loss resistance of the resonator.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, oscillators that generate mm-wave frequency signals suffer from issues of phase noise and tuning range. Typically, a VCO includes a resonator in which a capacitor and inductor resonate to give the frequency of oscillation when provided with energy. Sources of inaccuracy can change the oscillation frequency. One source of inaccuracy is an inconsistency in the dimensions of the capacitor and inductor in the manufacturing. Embodiments of the resonator described herein provide a frequency of oscillation that is referenced to the speed of light and is independent of at least one dimension and up to two dimensions.

Figure 1:
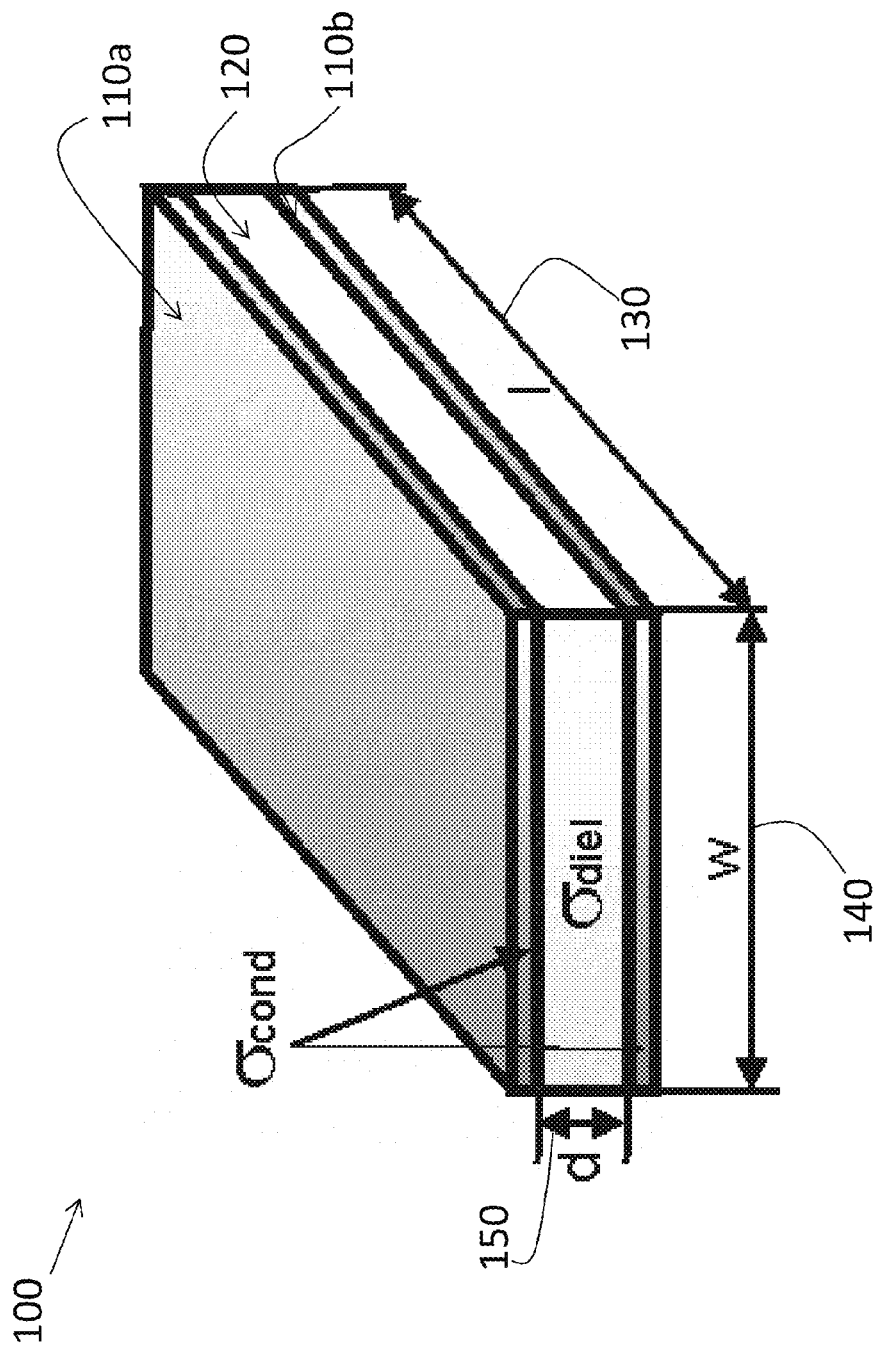
FIG. 1 illustrates a parallel plate transmission line according to an embodiment of the invention.

FIG. 1 illustrates a parallel plate transmission line 100 according to an embodiment of the invention. The transmission line 100 shown in FIG. 1 is a building block of the resonator 300 (see e.g., FIG. 3) according to embodiments of the invention. The transmission line 100 includes two metal plates 110a, 110b arranged in parallel with a dielectric material 120 separating them. The dimensions of the transmission line 100 are given by a length (l), width (w), and depth of the dielectric material 120 (d) which is the distance of separation between the two metal plates 110a, 110b. The resistance of the transmission line 100 ($R_{Line}$) is given by:

$$R_{Line} = \frac{2}{w * \sigma_{cond} * \delta} \quad [\text{EQ. 1}]$$

where w is the width of the transmission line metal plates 110a and 110b as shown in FIG. 1, $\sigma_{cond}$ is the conductance of the metal plates 110a, 110b, and $\delta$ is the skin effect, which is given by:

$$\delta = \sqrt{\frac{2}{\omega * \mu * \sigma_{cond}}} \quad [\text{EQ. 2}]$$

where $\omega$ is the frequency of the transmission line 100 in radians and $\mu$ is the permeability. The inductance per unit length of the transmission line 100 ($L_{Line}$) is given by:

$$L_{Line} = \mu_0 * \mu_r * \frac{d}{w} \left[\frac{\text{Henry}}{\text{meter}}\right] \quad [\text{EQ. 3}]$$

Where d is the distance between the transmission line metal plates 110a and 110b as shown in FIG. 1, $\mu_0$ (permeability in a vacuum) and $\mu_r$ (relative permeability of the transmission line 100 with respect to $\mu_0$) are the total permeability ($\mu$). As EQ. 3 indicates, the inductance decreases as the width of the transmission line metal plates 110a and 110b increases. The capacitance per unit length of the transmission line 100 ($C_{Line}$) is given by:

$$C_{Line} = \varepsilon_0 * \varepsilon_r * \frac{w}{d} \left[\frac{\text{Farad}}{\text{meter}}\right] \quad [\text{EQ. 4}]$$

where $\varepsilon_0 * \varepsilon_r$ is the total dielectric constant. As EQ. 4 indicates, the capacitance increases as the width of the transmission line metal plates 110a and 110b increases. That is, although FIGS. 2, 3, and 5-8 show capacitors, alternate embodiments of the invention include transmission lines 100 forming inductors (see e.g., FIGS. 9 and 10) based on the width of the transmission line metal plates 110a and 110b that make up the transmission lines 100. The conductance per unit length of the transmission line 100 ($G_{Line}$) is given by:

$$G_{Line} = \sigma_{cond} * \frac{w}{d} \left[\frac{\text{Siemens}}{\text{meter}}\right] \quad [\text{EQ. 5}]$$

Figure 2:
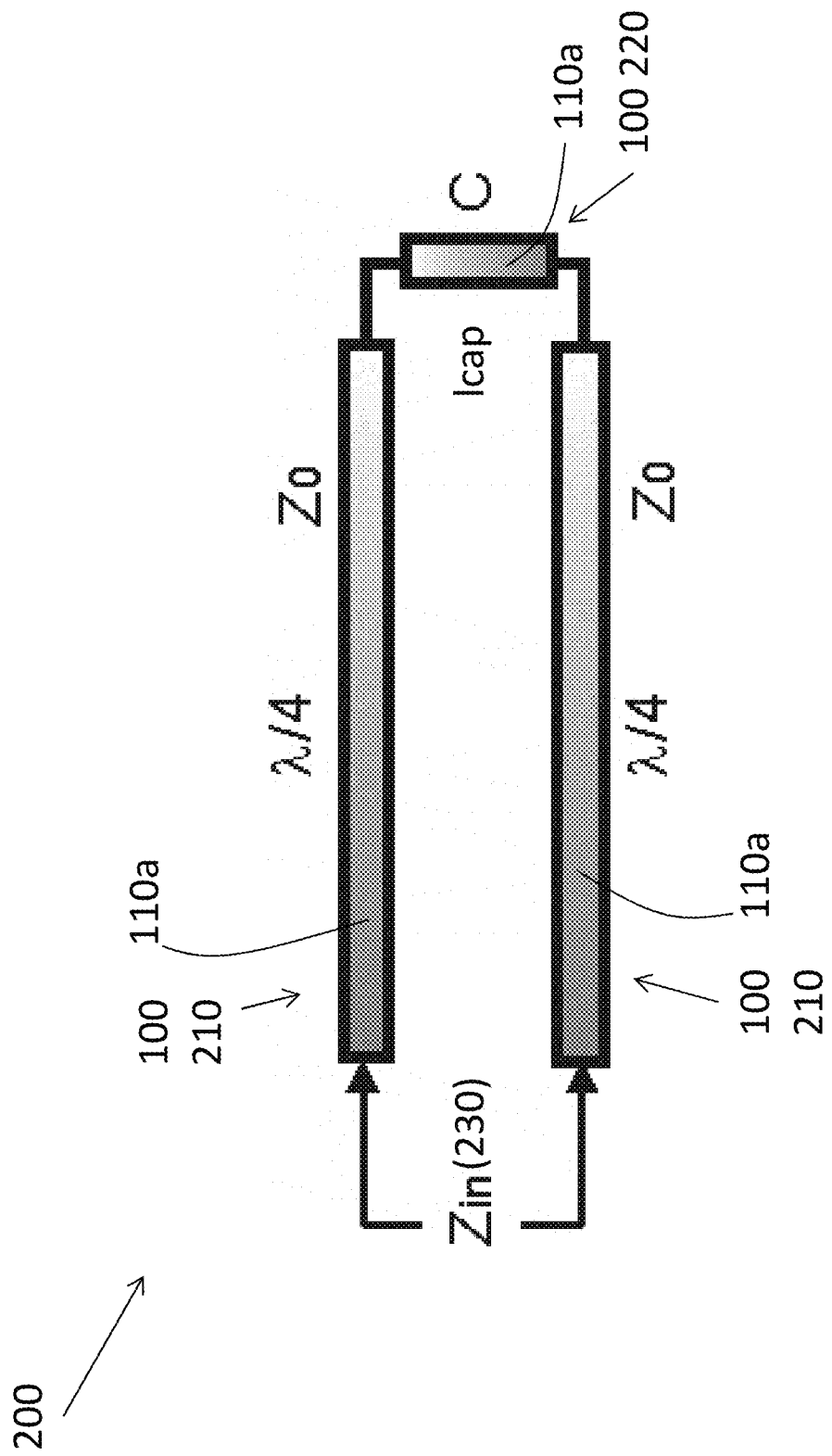
FIG. 2 shows a quarter lambda ($\lambda/4$) transformer and a capacitor, both comprising the parallel plate transmission lines according to an embodiment of the invention.

FIG. 2 shows a quarter lambda ($\lambda/4$) transformer 200 and a capacitor C 220, both comprising the parallel plate transmission lines 100 according to an embodiment of the invention. The quarter lambda transformer 200 forms the inductor of the resonator 300 (see e.g., FIG. 3). As shown in FIG. 2, the quarter lambda transformer 200 comprises three transmission lines 100 as shown and discussed with reference to FIG. 1, the metal plate 110a of each being visible in FIG. 2. The width (w) and depth (d) of each of the transmission lines 100 shown in FIG. 2 are assumed to be the same. The length (l) of the waveguides 210 is a quarter of the wavelength corresponding to the transmission frequency, and the length of capacitor C 220 is given by lcap (capacitor C 220 and the corresponding capacitance C are both references with C). The input impedance (230) $Z_{in}$ is given by:

$$Z_{in} = \frac{Z_0^2}{Z_C} = j\omega C * Z_0^2 = j\omega L \quad [\text{EQ. 6}]$$

where the impedance of the waveguides 210 is $Z_0$, the load or capacitor 220 impedance is $Z_C$, C is the capacitance, and L is the inductance. As a result, using EQ. 6, the inductance L is given by:

$$L = Z_0^2 * C \quad [\text{EQ. 7}]$$

According to EQ. 4, which provides the capacitance per unit length, the capacitance C may also be written as:

$$C = \varepsilon_0 * \varepsilon_r * \frac{w}{d} * l \quad [\text{EQ. 8}]$$

In addition, the impedance of the waveguides 210 is given by:

$$Z_0 = \frac{d}{w} * \sqrt{\frac{\mu_0 * \mu_r}{\varepsilon_0 * \varepsilon_r}} \quad [\text{EQ. 9}]$$

By substituting the capacitor C 220 capacitance (C) from EQ. 8 and the waveguide 210 inductance ($Z_0$) from EQ. 9 into EQ. 7, the inductance of the quarter lambda transformer 200 may be determined as:

$$L = \mu_0 * \mu_r * \frac{d * l}{w} \quad [\text{EQ. 10}]$$

Figure 3:
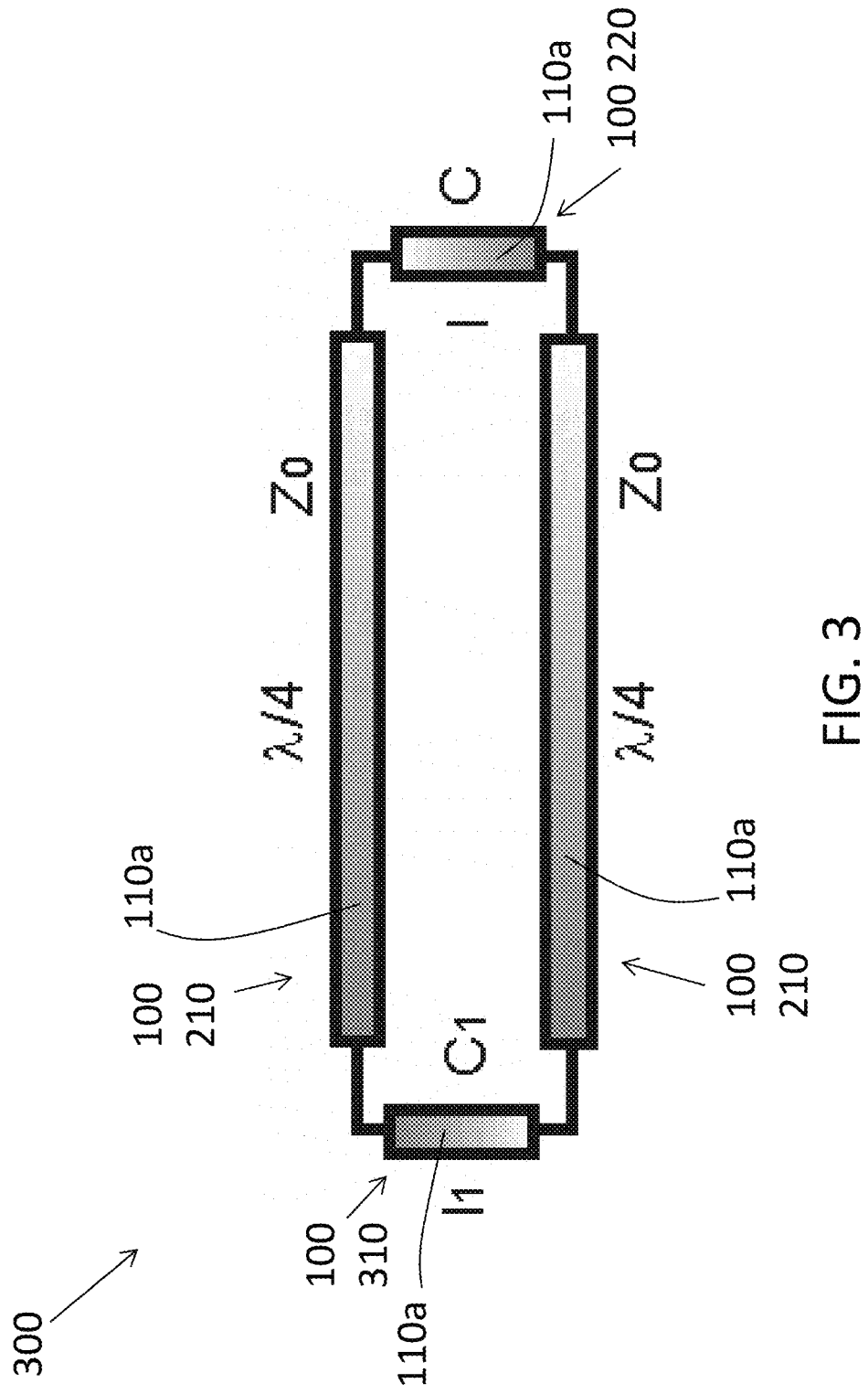
FIG. 3 shows a transmission line resonator according to an embodiment of the invention.

FIG. 3 shows a transmission line resonator 300 according to an embodiment of the invention. The resonator 300 includes the quarter lambda transformer 200 shown in FIG. 2, which acts as the inductor of the resonator 300 with inductance indicated by EQ. 10. The resonator 300 also includes the capacitor $C_1$ 310, which acts as the capacitor of the resonator 300 with a capacitance given by:

$$C_1 = \varepsilon_0 * \varepsilon_r * \frac{w}{d} * l_1 \quad [\text{EQ. 11}]$$

where $l_1$ is the length of the capacitor $C_1$ 310. With the inductance (L) given by EQ. 10 and capacitance ($C_1$) given by EQ. 11, the oscillation frequency ($f_{osc}$) of the resonator 300 in Hertz (Hz) is:

$$f_{osc} = \frac{1}{2\pi\sqrt{LC_1}} = \frac{1}{2\pi\sqrt{l * l1}} * \frac{c}{\sqrt{\varepsilon_r * \mu_r}} \quad [\text{EQ. 12}]$$

where the speed of light (c) is given by:

$$c = \frac{1}{\sqrt{\varepsilon_0 * \mu_0}} \quad [\text{EQ. 13}]$$

As EQ. 12 illustrates, the frequency of oscillation of the resonator 300 is referenced to the speed of light (c) and is independent of the width and depth of the transmission lines 100 that make up the resonator 300. Instead, the oscillation frequency depends on the lengths (l and $l_1$) corresponding with the capacitors C 220 and $C_1$ 310 and the material properties ($\in_r$ and $\mu_r$) of the metal plates 110a of the transmission lines 100. The precision with which the oscillation frequency is attained depends on the precision of the mask involved in the processing of the integrated circuit. The precision of the oscillation frequency is represented by a variation ($\Delta f_{osc}$) in the frequency of oscillation and is given by:

$$\frac{\Delta f_{osc}}{f_{osc}} = -\frac{1}{2}\left(\frac{\Delta l}{l} + \frac{\Delta l_1}{l_1}\right) \quad [\text{EQ. 14}]$$

Figure 4:
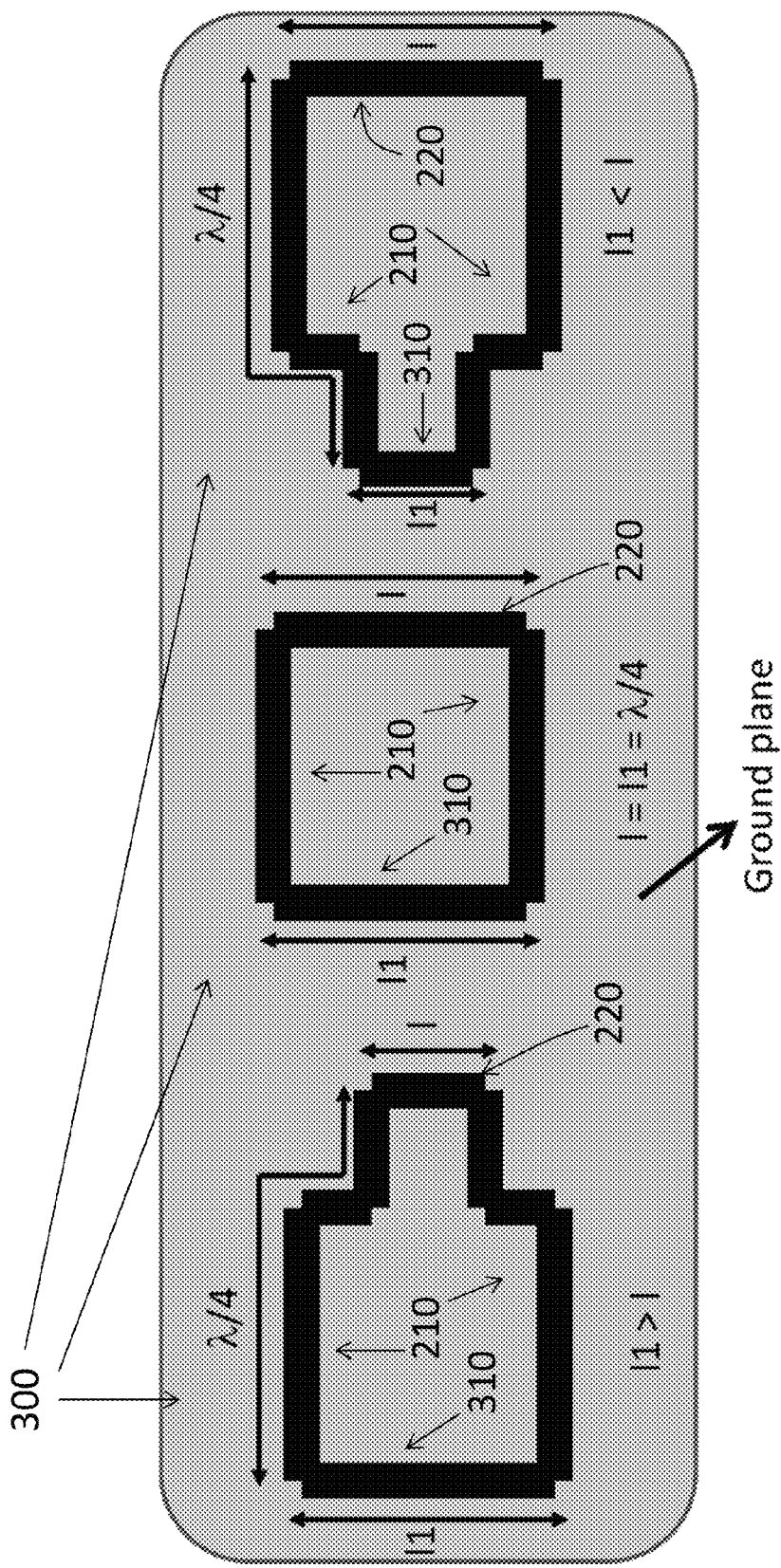
FIG. 4 illustrates exemplary arrangements of the transmission lines of the resonator according to embodiments of the invention.

FIG. 4 illustrates exemplary arrangements of the transmission lines 100 of the resonator 300 according to embodiments of the invention. The length of the waveguides 210 are always a quarter of the wavelength corresponding with the oscillation frequency. However, that length ($\lambda/4$) may be implemented in a stepped fashion in some embodiments and as a straight line in other embodiments, as shown in FIG. 4. The overall length of the waveguides 210 according to any of the arrangements is a quarter of the wavelength corresponding with the oscillation frequency (the inductor of the resonator 300 is implemented as a quarter lambda transformer) and the oscillation frequency of the resonator 300 depends only on the lengths (l and $l_1$) of the capacitors C 220 and $C_1$ 310, respectively.

Figure 5:
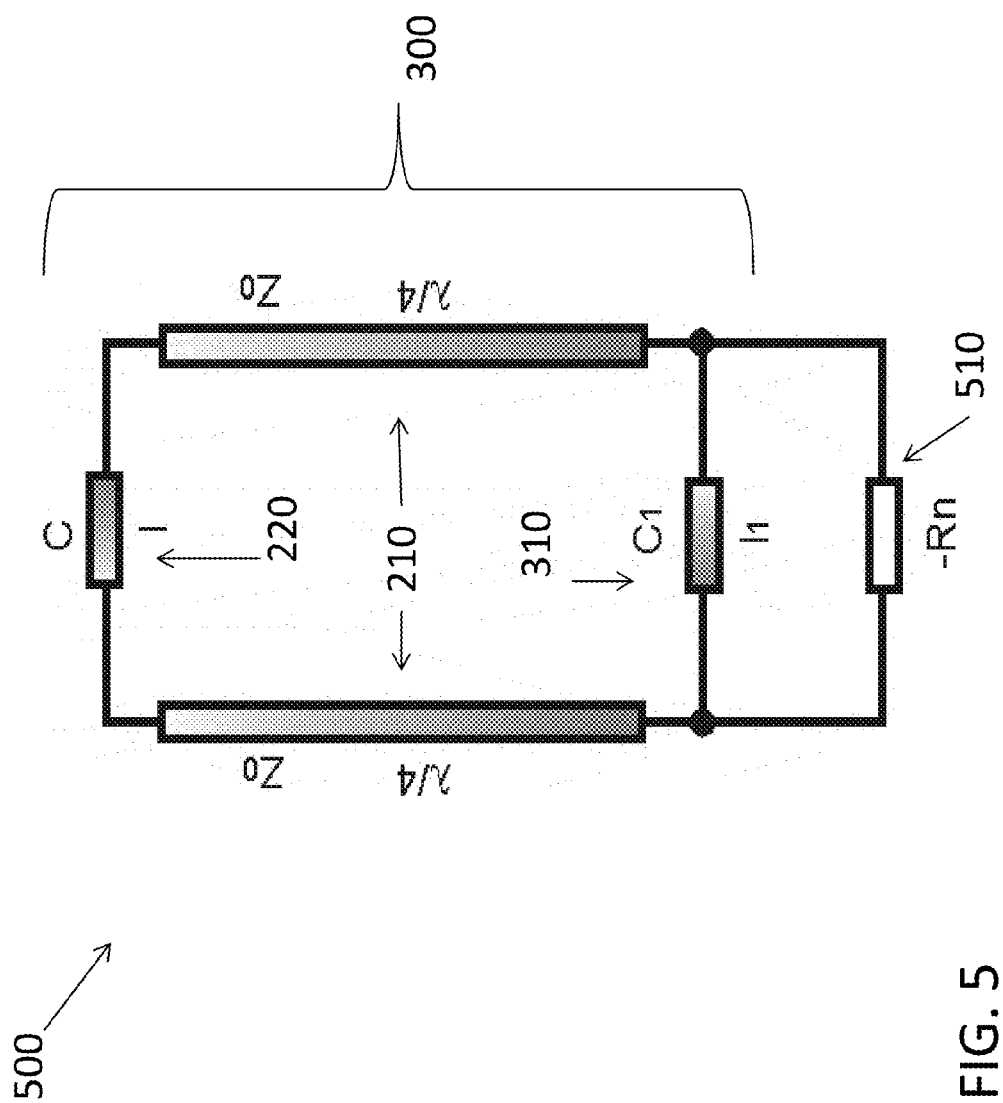
FIG. 5 depicts a fixed frequency oscillator according to an embodiment of the invention.
Figure 6:
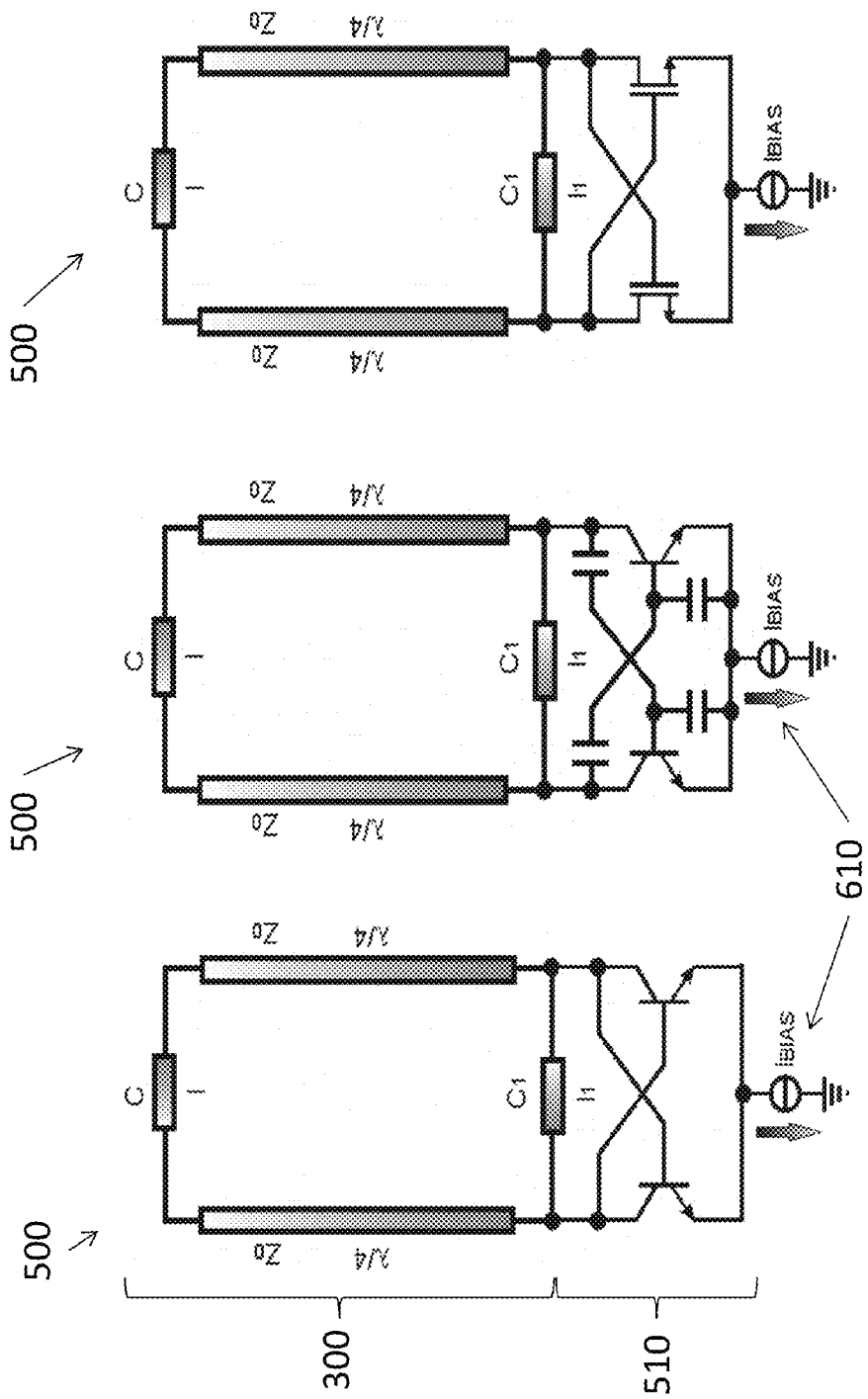
FIG. 6 illustrates exemplary oscillators according to different embodiments of the invention.

FIG. 5 depicts a fixed frequency oscillator 500 according to an embodiment of the invention. The oscillator 500 includes the resonator 300 comprised of the transmission lines 100 and a negative resistance 510 ($-R_N$). The negative resistance 510 ($-R_N$) essentially creates a resonator 300 with no damping and can be thought of as adding energy to the system. If the oscillation loss of the resonator 300 were modeled as a resistance (R), then the negative resistance 510 ($-R_N$) cancels out the resistance (R). FIG. 6 illustrates exemplary fixed frequency oscillators 500 according to different embodiments of the invention. FIG. 6 shows three different exemplary topologies of the oscillator 500 with three different implementations of the negative resistance 510 ($-R_N$). Each of the exemplary topologies of the oscillator 500 also includes the application of a bias voltage resulting in the bias current 610. The oscillators 500 may be used in CMOS or bipolar transistor applications.

Figure 7:
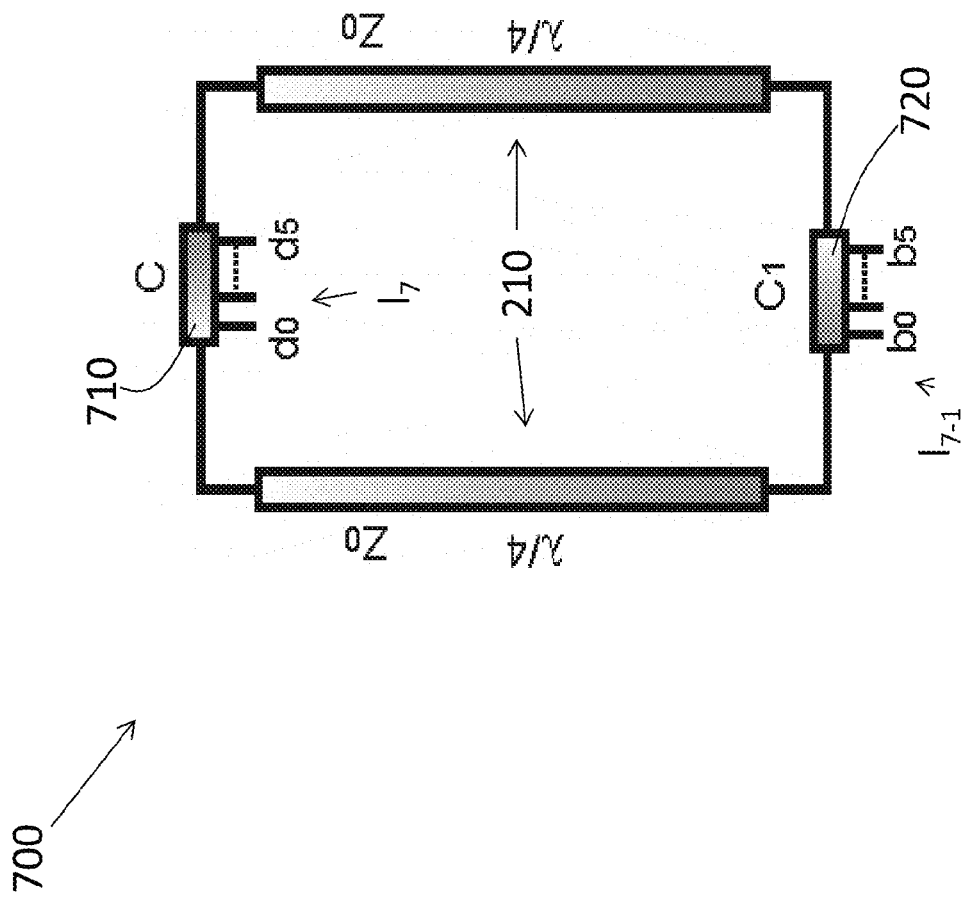
FIG. 7 depicts a variable frequency transmission line resonator including tunable capacitors according to an embodiment of the invention.
Figure 8:
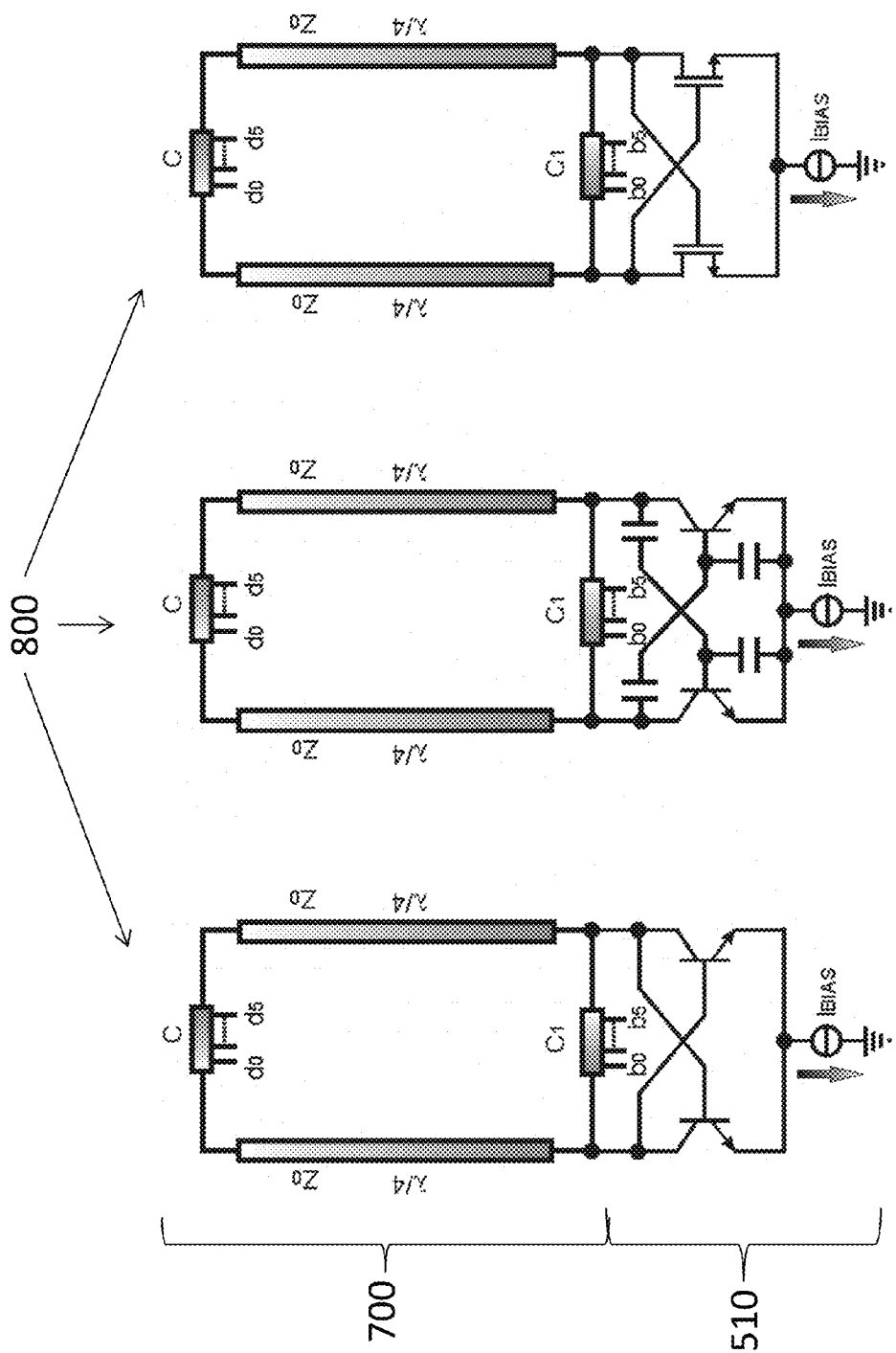
FIG. 8 illustrates exemplary oscillators including tunable capacitors according to embodiments of the invention.

FIG. 7 depicts a variable frequency transmission line 100 resonator 700 including tunable capacitors (C 710 and $C_1$ 720) according to an embodiment of the invention. Like the resonator 300 shown in FIG. 3, the resonator 700 of FIG. 7 is implemented using transmission lines 100. However, unlike the fixed-frequency resonator 300, the resonator 700 has a tunable oscillation frequency as discussed below. The capacitors (C 710 and $C_1$ 720) of the resonator 700 may be implemented as variable capacitors with variable lengths ($l_7$ and $l_{7-1}$, respectively). Because the oscillation frequency depends on the lengths ($l_7$ and $l_{7-1}$) of the capacitors (C 710 and $C_1$ 720) as shown in EQ. 12, the oscillation frequency varies as the lengths ($l_7$ and $l_{7-1}$) vary. As shown in FIG. 7, exemplary lengths ($l_7$) for the transmission line 100 making up the capacitor C 710 of the quarter lambda transformer (inductor of the resonator 700) may be within a range $d_0$ through $d_5$ with any number of incremental values in between. Exemplary lengths ($l_{7-1}$) for the transmission line 100 making up the capacitor $C_1$ 720 of the resonator 700 may be within a range $b_0$ through $b_5$. One or both of the lengths ($l_7$ and $l_{7-1}$) may be changed at one time to adjust the oscillator frequency. The capacitors (C 710 and $C_1$ 720) may be tuned digitally. By tuning one or both of the capacitors (C 710 and $C_1$ 720), the resonator 700 may be implemented as a tunable resonator with two independent tuning inputs. FIG. 8 illustrates exemplary oscillators 800 including tunable capacitors according to embodiments of the invention. The three different exemplary topologies of the oscillators 800 shown in FIG. 8 include tunable capacitors (C 220 and $C_1$ 310) such that the oscillators 800 have tunable oscillation frequencies. FIG. 8 shows three different exemplary implementations of the negative resistance 510 ($-R_N$). The three implementations of the negative resistance 510 ($-R_N$) shown in FIG. 8 for the tunable oscillation frequency oscillators 800 are the same as those shown in FIG. 6 for the fixed oscillation frequency oscillators 500.

Figure 9:
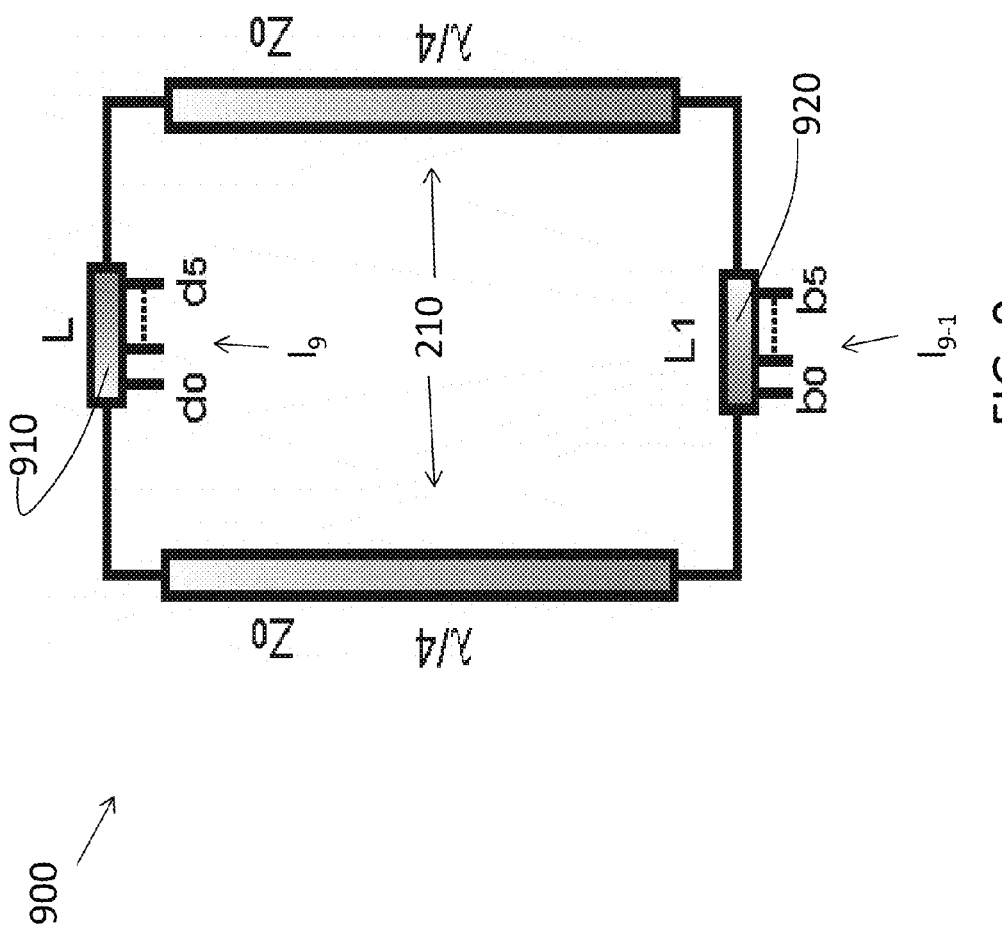
FIG. 9 depicts a variable frequency transmission line resonator including tunable inductors according to an embodiment of the invention.
Figure 10:
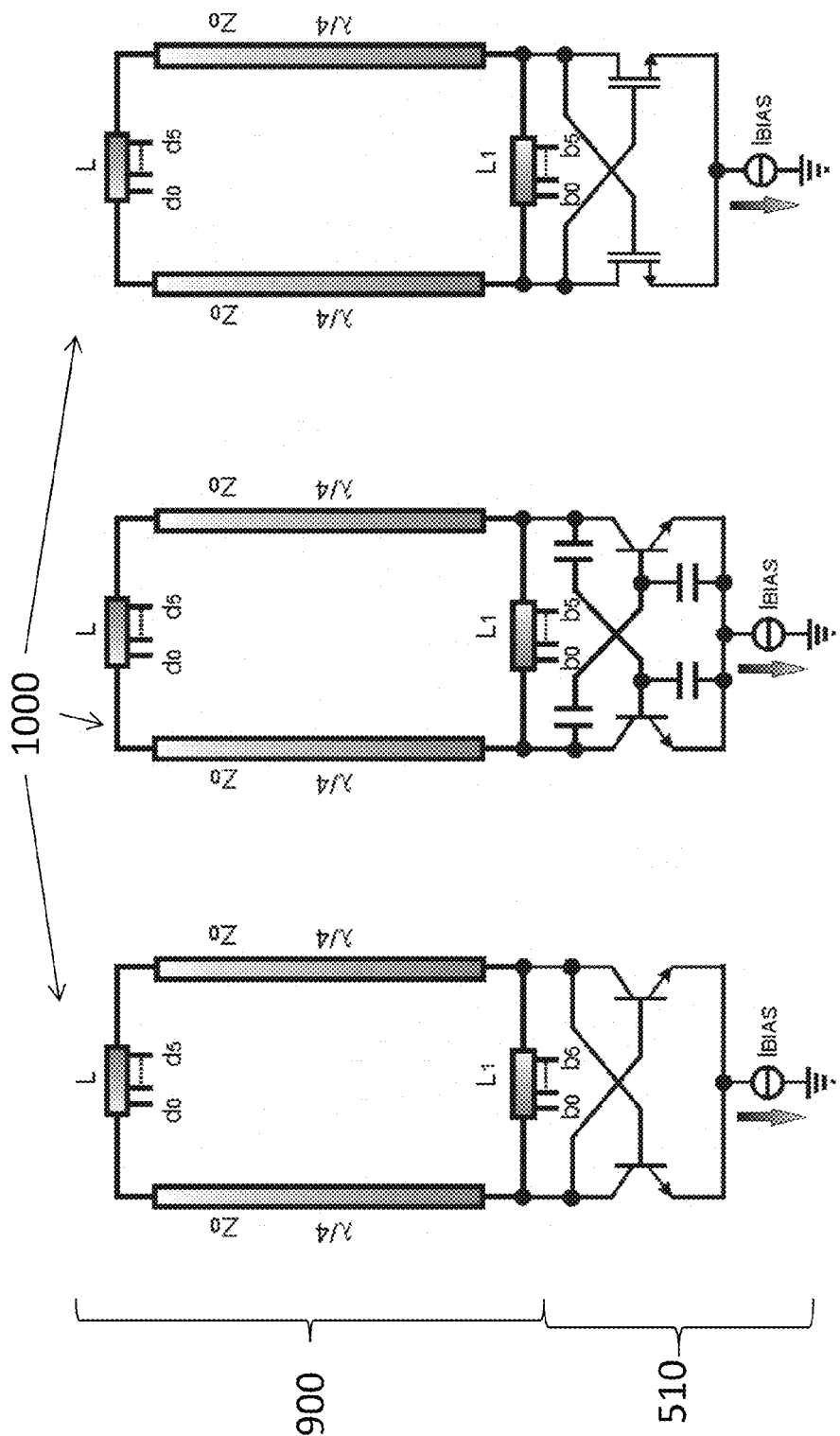
FIG. 10 illustrates exemplary oscillators including tunable inductors according to embodiments of the invention.

FIG. 9 depicts a variable frequency transmission line 100 resonator 900 including tunable inductors (L 910 and $L_1$ 920) according to an embodiment of the invention. The resonator 900 includes inductors L 910 and $L_1$ 920 that have respective tunable lengths $l_9$ and $l_{9-1}$. The relationship between inductance of the inductor L 910 and capacitance is given by EQ. 7 above and depends on the impedance $Z_0$ of the transmission lines 100 making up the waveguides 210. The length ($l_9$ and $l_{9-1}$) of the inductors (L 910 and $L_1$ 920) may be adjusted individually or collectively to adjust the oscillation frequency of the resonator 900. While the same ranges ($d_0$ through $d_5$ and $b_0$ through $b_5$) of adjustment are shown for the lengths $l_9$ and $l_{9-1}$ of the inductors L 910 and $L_1$ 920, respectively, as are shown for the lengths $l_7$ and $l_{7-1}$ of the adjustable capacitors C 710 and $C_1$ 720 shown in FIGS. 7 and 8, the ranges need not be the same. As with the resonator shown in FIG. 7, the resonator 900 of FIG. 9 is tunable with two independent inputs (i.e., inductor L 910 and $L_1$ 920 lengths $l_9$ and $l_{9-1}$). FIG. 10 illustrates exemplary oscillators 1000 including tunable inductors (L 910 and $L_1$ 920) according to embodiments of the invention. The three different exemplary topologies of the oscillators 1000 shown in FIG. 10 include tunable inductors (L 910 and $L_1$ 920) such that the oscillators 1000 have tunable oscillation frequencies. FIG. 10 shows three different exemplary implementations of the negative resistance 510 ($-R_N$). The three implementations of the negative resistance 510 ($-R_N$) shown in FIG. 10 for the tunable oscillation frequency oscillators 1000 are the same as those shown in FIG. 6 (for the fixed oscillation frequency oscillators 500) and FIG. 8 (for the tunable oscillation frequency oscillators 700).

Figure 11:
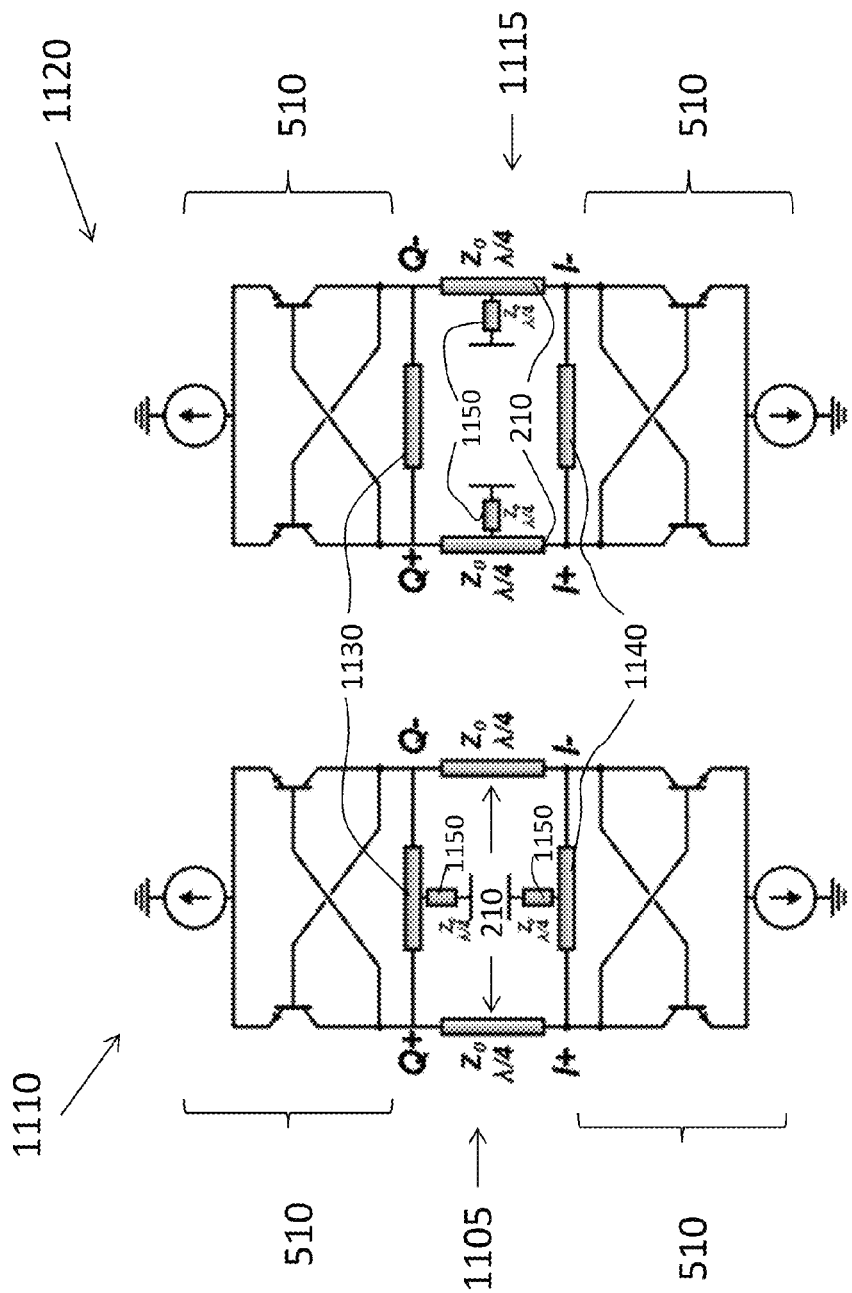
FIG. 11 shows quadrature oscillators according to embodiments of the invention.

FIG. 11 shows quadrature oscillators 1110, 1120 according to embodiments of the invention. Each of the quadrature oscillators 1110, 1120 has a symmetric structure with an exemplary implementation of the negative resistance 510 ($-R_N$) on each side of the resonator 1105, 1115. As a result of the symmetrical arrangement, two output oscillation frequencies, with a 90 degree phase difference between them, are obtained from each of the quadrature oscillators 1110, 1120. The resonators 1105, 1115 include the waveguides 210. The other two transmission lines 100 (1130, 1140) may be capacitors (220, 310), as discussed with reference to FIG. 3, tunable capacitors (710, 720), as discussed with reference to FIG. 7, or tunable inductors (910, 920), as discussed with reference to FIG. 9. The resonators 1105, 1115 may be fabricated according to any of the embodiments discussed above. As such, the resonators 1105, 1115 have a quadrature oscillation frequency that is referenced to the speed of light and is independent of with width (w) and depth (d) of the transmission lines 100 that comprise the resonators 1105, 1115 (see e.g., EQ. 12). Each of the resonators 1105, 1115 shows biasing, through quarter wavelength lines 1150, of the transmission lines 1130, 1140 (in resonator 1106) or the waveguides 210 (in resonator 1115).

Figure 12:
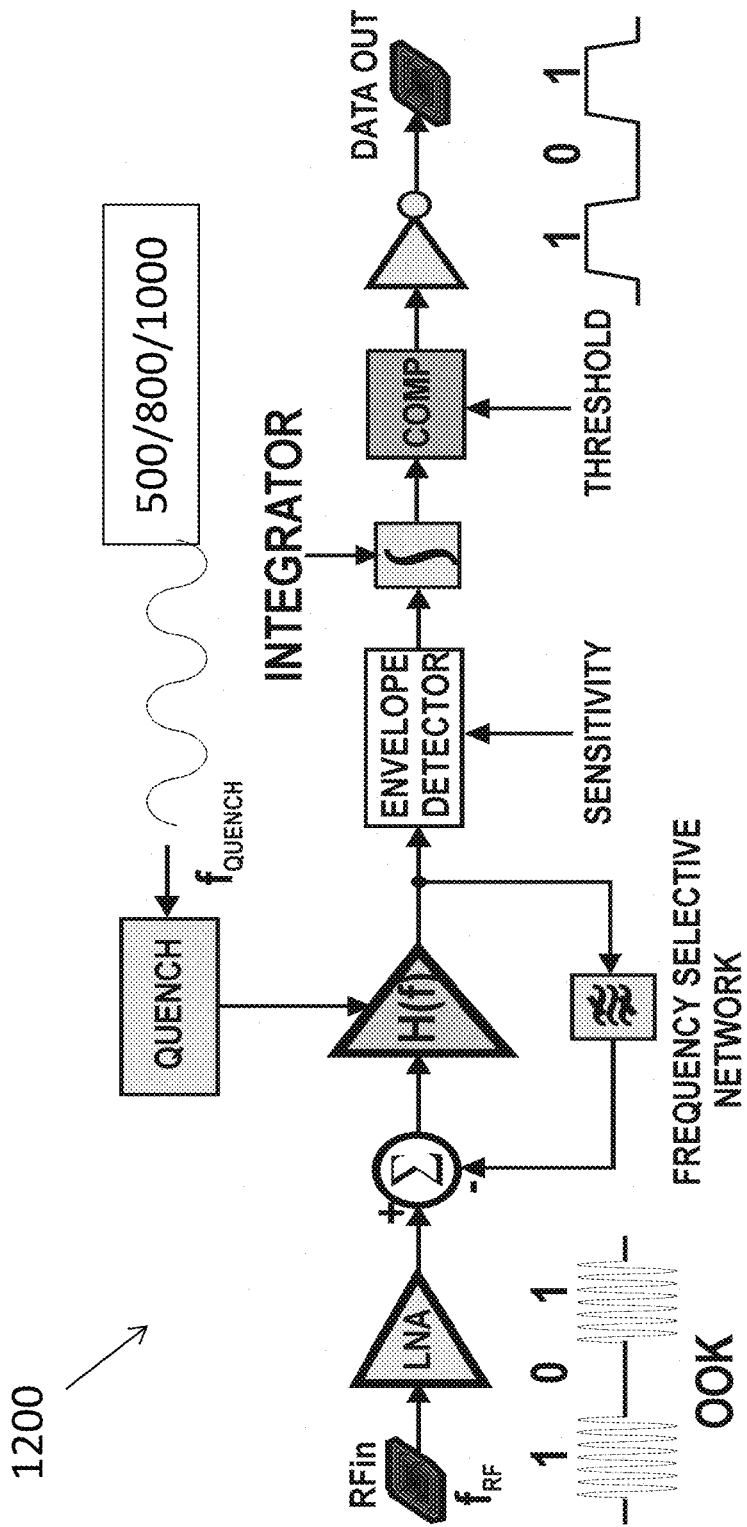
FIG. 12 is a block diagram of an on-off keying receiver including the oscillator according to embodiments of the invention.
Figure 13:
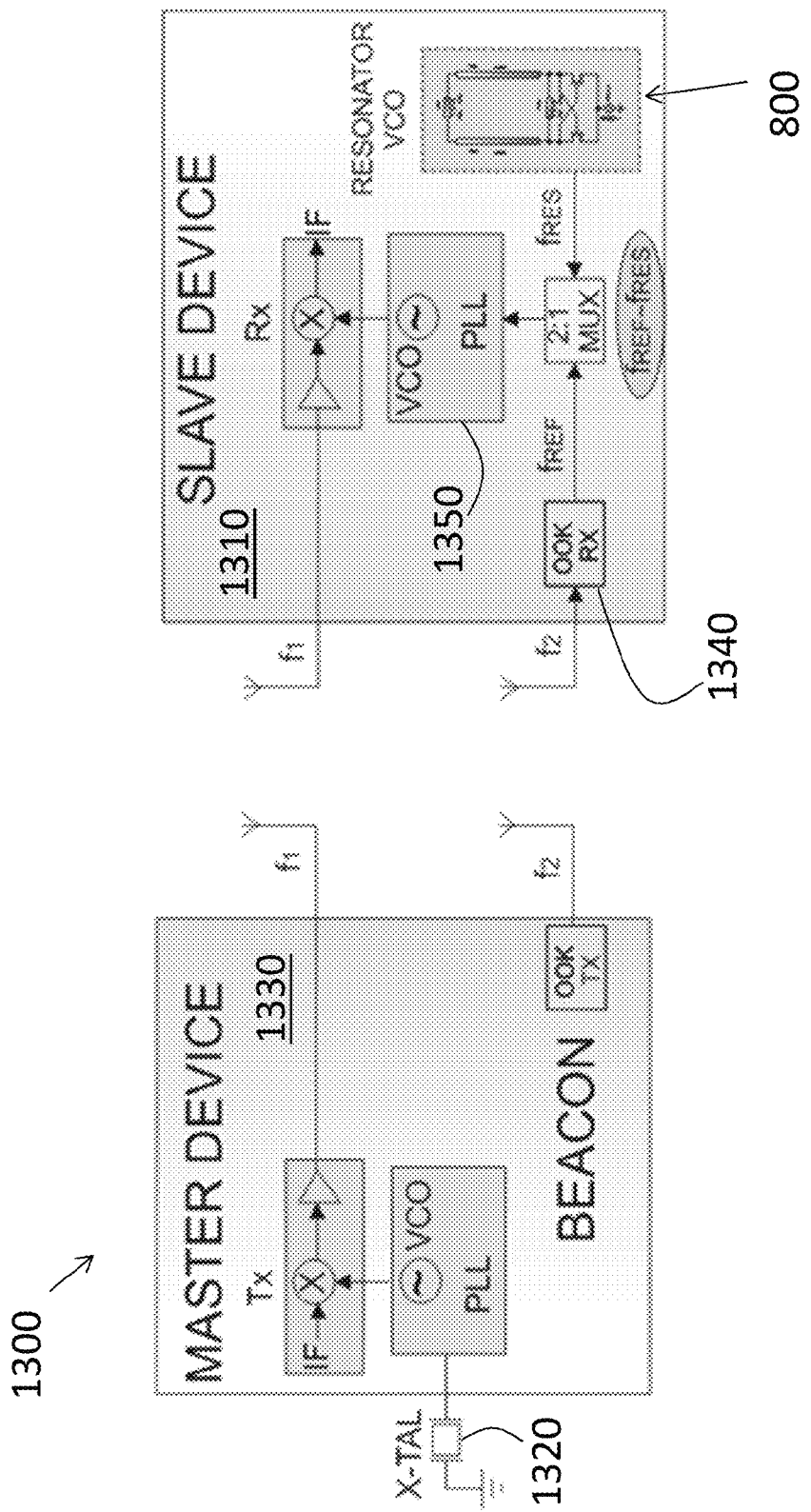
FIG. 13 is a block diagram of radios that include an oscillator according to an embodiment of the invention.
Figure 14:
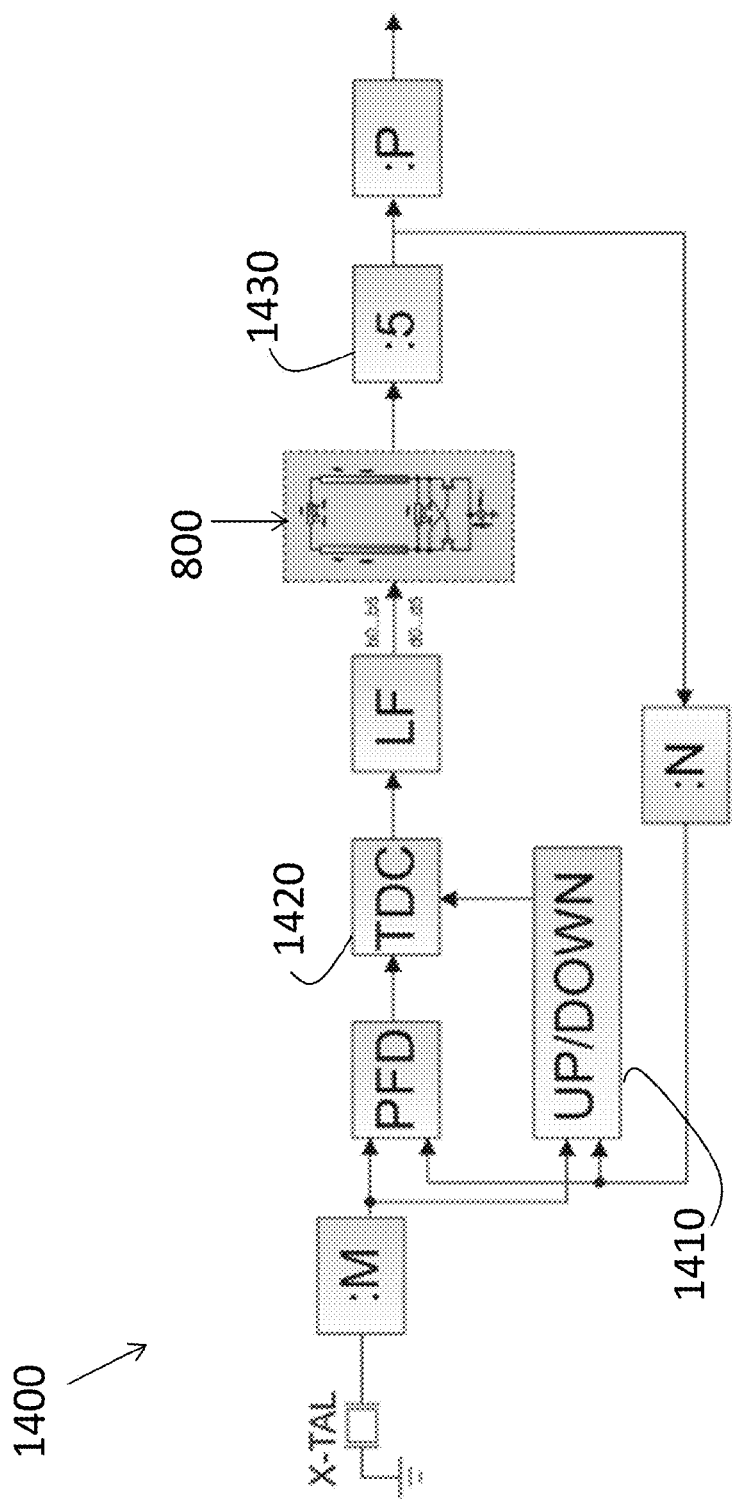
FIG. 14 is a block diagram of a mm-wave digital phase locked loop (PLL) that includes an oscillator according to an embodiment of the invention.
Figure 15:
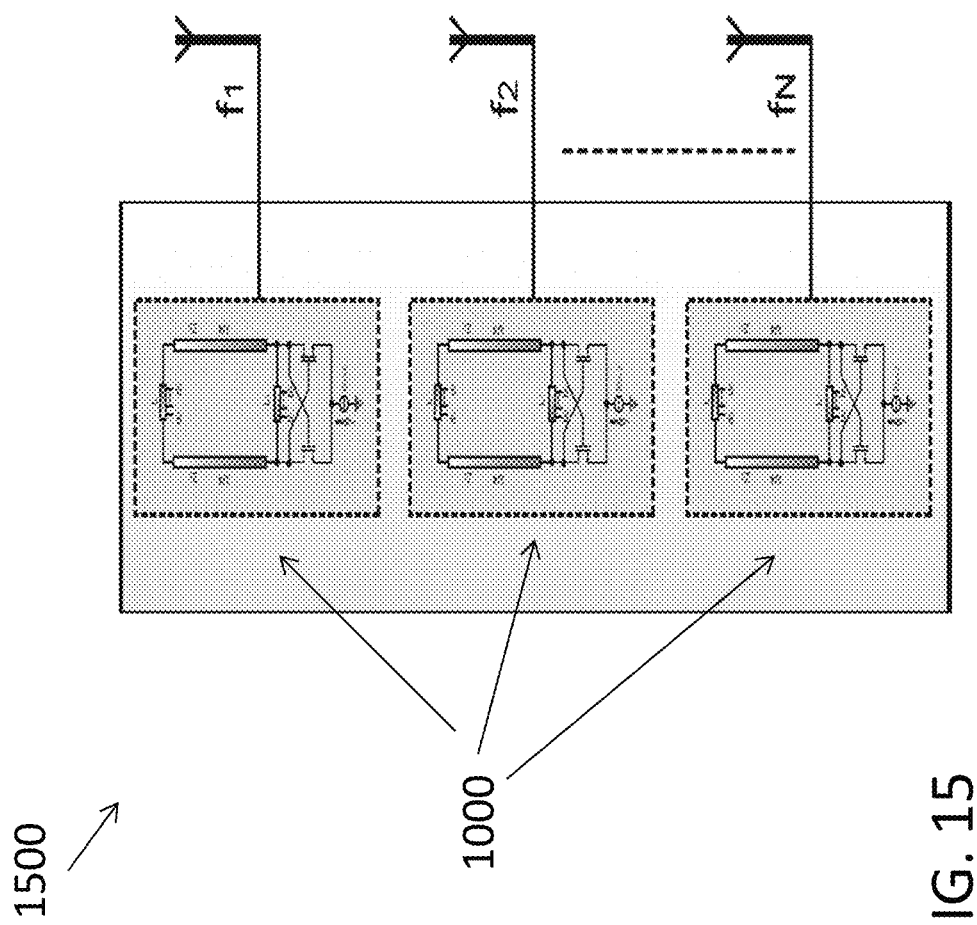
FIG. 15 is a block diagram of oscillators according to an embodiment of the invention that may be used in a terahertz (THz) source.

The various embodiments of the fixed frequency and variable frequency oscillators (500, 800, 1000, 1110, 1120) discussed above may be used in any application requiring an oscillator. For example, FIG. 12 is a block diagram of an on-off keying (OOK) receiver 1200 including the oscillator (500, 800, 1000) according to embodiments of the invention. In the OOK receiver 1200 according to one embodiment, the oscillator 500 may provide the quench signal. The oscillator 500 in this application may be generated with an on-chip reference based on a fixed resonator voltage controlled oscillator without an external crystal oscillator. The accuracy of the oscillator 500 frequency (quench frequency) may be precise within the mask accuracy and is acceptable as long as the frequency is greater than a multiple (e.g., 60 times) the receiver input frequency. The tunable oscillators (800, 1000) may also be used in this application. As another example, FIG. 13 is a block diagram of radios 1300 that include an oscillator 800 according to an embodiment of the invention. The oscillator 800 may be used as a reference for crystal-less radios 1300. As FIG. 13 illustrates, the slave device 1310 has no crystal (like the crystal 1320 of the master device 1330). The OOK receiver 1340 is always on. If a beacon from the master device 1330 is present, the phase locked loop (PLL) 1350 switches to the external reference ($f_{REF}$) from the OOK receiver 1340. Without the beacon from the master device 1330, the PLL 1350 takes the reference from the on-chip oscillator 800. The slave device 1310 locks to the master device 1330 immediately because the PLL 1350 acquires reference frequency ($f_{REF}$) information from the beacon and the difference between $f_{REF}$ and $f_{RES}$ (the frequency from the oscillator 800) is very small. Thus, the pull-in time for the PLL 1350 (to switch from $f_{RES}$ to $f_{REF}$ is very small). FIG. 14 is a block diagram of a millimeter wave (mm-wave) digital PLL 1400 that includes an oscillator 800 according to an embodiment of the invention. The up/down converter 1410 detects the sign of the time-to-digital converter (TDC) 1420. The divider 1430 works at mm-waves and may be realized with resonant loads. As yet another example, FIG. 15 is a block diagram of oscillators 1000 according to an embodiment of the invention that may be used in a THz source 1500.

Figure 16:
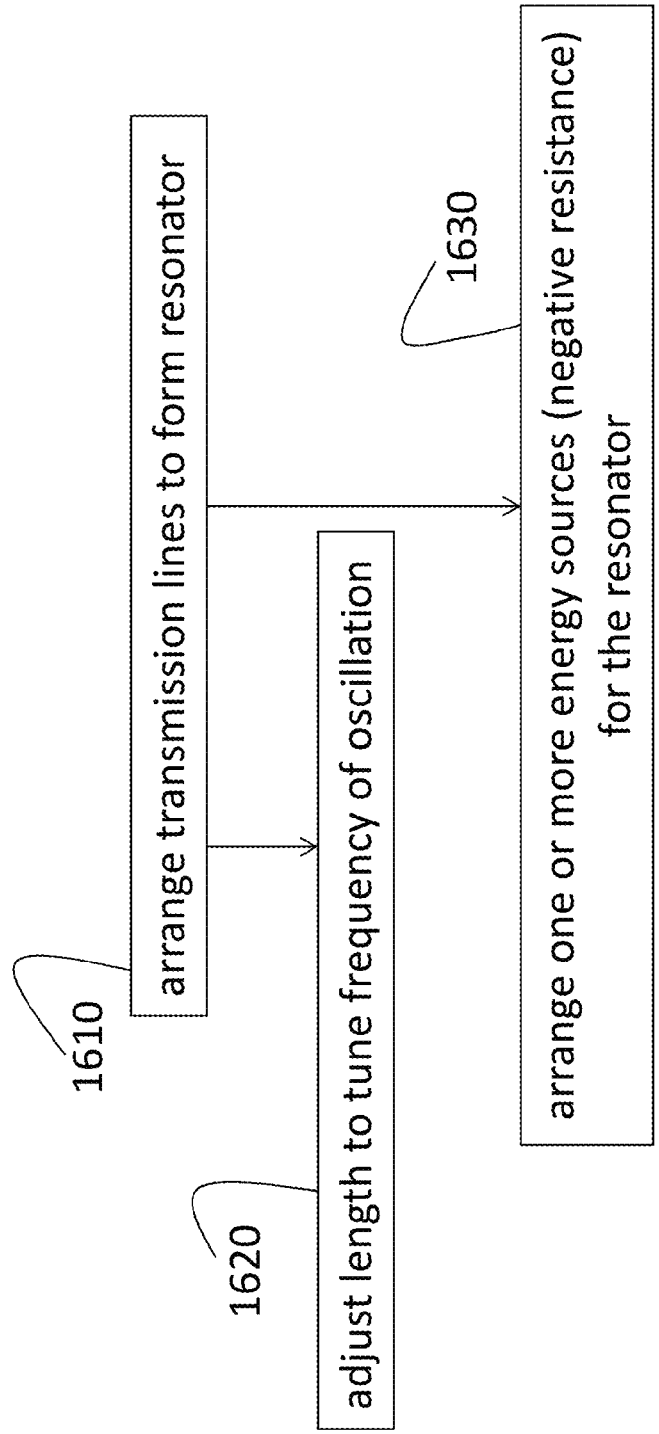
FIG. 16 is a process flow of a method of fabricating an oscillator according to embodiments described herein.

FIG. 16 is a process flow of a method of fabricating an oscillator (500, 800, 1000, 1110, 1120) according to embodiments described herein. At block 1610, arranging transmission lines 100 to form a resonator (300, 700, 900, 1105, 1115) may be according to the various embodiments described above. The transmission lines 100 used as waveguides 210 may be combined with a fixed-length capacitor (C 220) or variable-length capacitor (C 710) or variable-length inductor (L 910) and the resonator additionally includes a fixed-length capacitor ($C_1$ 310) or variable-length capacitor ($C_1$ 720) or variable-length inductor ($L_1$ 920). At block 1620, adjusting the length to tune the frequency of oscillation includes adjusting the capacitor (C 220, 710) or inductor (L 710), adjusting the capacitor ($C_1$ 310, 720) or inductor ($L_1$ 920), or both as discussed with reference to FIGS. 7 and 9. At block 1630, arranging one or more energy sources (negative resistance 510) for the resonator (300, 700, 900, 1105, 1115) arranged according to blocks 1610 and, optionally, 1620 may include providing a single energy source to obtain an oscillator (500, 800, 1000) or two symmetric energy sources to obtain a quadratic oscillator (1110, 1120).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating an oscillator, the method comprising:
   arranging a plurality of transmission lines to form a resonator whose oscillation frequency is a function of the speed of light and is independent of at least one dimension of the plurality of transmission lines; and
   coupling a negative resistance circuit to the resonator, the negative resistance circuit being configured to cancel internal loss resistance of the resonator, wherein the arranging the plurality of transmission lines includes arranging four transmission lines and selecting a first transmission line and a second transmission line of the four transmission lines to have a respective first length and second length of one-fourth of a wavelength corresponding with the oscillation frequency.

2. The method according to claim 1, wherein the first transmission line and the second transmission line are separated by a third transmission line.

3. The method according to claim 1, wherein the arranging the four transmission lines includes selecting a third transmission line to have a third length that is different than the first length and the second length.

4. The method according to claim 1, wherein the arranging the four transmission lines includes selecting a third transmission line to have a third length that is a same length as the first length and the second length.

5. The method according to claim 1, further comprising adjusting a length of a third transmission line of the four transmission lines to tune the oscillation frequency.

6. The method according to claim 5, further comprising adjusting a length of a fourth transmission line of the four transmission lines to tune the oscillation frequency.

7. The method according to claim 1, further comprising coupling a second negative resistance circuit to the resonator.

8. The method according to claim 7, further comprising arranging the negative resistance circuit and the second negative resistance circuit symmetrically with respect to the resonator.

9. The method according to claim 8, wherein the oscillator is a quadrature oscillator providing two output signals having a same frequency that are 90 degrees out of phase with each other.

\* \* \* \* \*